US006566193B2

(12) United States Patent
Hofmann et al.

(10) Patent No.: US 6,566,193 B2
(45) Date of Patent: May 20, 2003

(54) METHOD FOR PRODUCING A CELL OF A SEMICONDUCTOR MEMORY

(75) Inventors: Franz Hofmann, München (DE); Till Schlösser, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/096,473

(22) Filed: Mar. 12, 2002

(65) Prior Publication Data

US 2002/0127796 A1 Sep. 12, 2002

(30) Foreign Application Priority Data

Mar. 12, 2001 (DE) .......................................... 101 11 755

(51) Int. Cl.[7] .......................................... H01L 21/8242
(52) U.S. Cl. .................. 438/245; 438/242; 438/386; 438/388; 438/250; 438/243; 438/238; 257/300; 257/301; 257/302
(58) Field of Search ................................ 438/238, 245, 438/388, 242, 243, 250, 386, 399; 257/300, 301, 302, 67–71, 905–906, 908

(56) References Cited

U.S. PATENT DOCUMENTS

| | | | |
|---|---|---|---|
| 5,208,657 A | | 5/1993 | Chatterjee et al. |
| 5,497,017 A | * | 3/1996 | Gonzales .................. 257/306 |
| 5,744,386 A | | 4/1998 | Kenney |
| 5,828,094 A | * | 10/1998 | Lee ........................... 257/296 |
| 5,907,170 A | * | 5/1999 | Forbes et al. ............ 257/296 |
| 6,018,174 A | * | 1/2000 | Schrems et al. ......... 257/296 |
| 6,091,094 A | * | 7/2000 | Rupp ......................... 257/296 |
| 6,172,390 B1 | * | 1/2001 | Rupp et al. ............... 257/302 |
| 6,172,391 B1 | * | 1/2001 | Goebel et al. ............ 257/305 |
| 6,177,699 B1 | * | 1/2001 | Perng et al. .............. 257/303 |
| 6,180,975 B1 | * | 1/2001 | Radens et al. ........... 257/306 |
| 6,255,683 B1 | * | 7/2001 | Radens et al. ........... 257/301 |
| 6,265,741 B1 | * | 7/2001 | Schrems ................... 257/301 |
| 6,265,742 B1 | * | 7/2001 | Gruening et al. ........ 257/304 |
| 6,316,309 B1 | * | 11/2001 | Holmes et al. .......... 438/246 |
| 6,320,215 B1 | * | 11/2001 | Bronner et al. .......... 257/301 |
| 6,335,239 B1 | * | 1/2002 | Agahi et al. .............. 438/245 |
| 6,365,452 B1 | * | 4/2002 | Perng et al. .............. 438/241 |
| 6,423,607 B1 | * | 7/2002 | Heineck et al. .......... 438/386 |
| 6,437,383 B1 | * | 8/2002 | Xu ............................. 257/300 |
| 6,440,794 B1 | * | 8/2002 | Kim .......................... 438/248 |
| 6,451,648 B1 | * | 9/2002 | Gruening et al. ........ 438/243 |

* cited by examiner

*Primary Examiner*—Phat X. Cao
*Assistant Examiner*—Thao X. Le
(74) *Attorney, Agent, or Firm*—Laurence A. Greenberg; Werner H. Stemer; Ralph E. Locher

(57) ABSTRACT

The process first forms trench capacitors in a substrate, which are filled with a trench fill and in which a first insulating layer is disposed over the conductive trench fill. The first insulating layer is then overgrown laterally by a selectively grown epitaxial layer. The selective epitaxial layer is so structured that a ridge is formed from it. Next, the ridge is partially undercut, whereby the etch selectivity of the ridge relative to the first insulating layer is utilized for a wet-chemical etching procedure. Next, a contact layer is arranged in the undercut region, which connects the ridge and a transistor that has been formed in the ridge to the conductive trench fill. Lateral margin ridges are then formed next to the ridge as a gate, and a doped region is incorporated into the ridge as a source/drain zone of the transistor.

9 Claims, 5 Drawing Sheets

METHOD FOR PRODUCING A CELL OF A SEMICONDUCTOR MEMORY

BACKGROUND OF THE INVENTION

FIELD OF THE INVENTION

The invention lies in the semiconductor technology field and pertains, more specifically, to a method for producing a cell of a semiconductor memory.

Semiconductor memories such as DRAMs (Dynamic Random Access Memories) consist of a cell field and a control periphery, with individual memory cells arranged in the cell field.

A DRAM chip contains a matrix of memory cells arranged in rows and columns, which are controlled by word lines and bit lines. Data is written into or read from the memory cells via the activation of suitable word lines and bit lines.

Typically, a memory cell of a DRAM contains a transistor which is connected to a capacitor. The transistor includes two diffusion regions, which are isolated from one another by a channel that is controlled by a gate. One diffusion region is referred to as a drain zone, and the other diffusion region is referred to as a source zone.

One of the diffusion regions is connected to a bit line; the other is connected to a capacitor; and the gate is connected to a word line. By applying appropriate voltages to the gate, the transistor is controlled such that a current flow between the diffusion regions through the channel is switched in and out.

The progressive miniaturization of memory elements gives rise to continually higher integration densities. The continual increase in integration density means that the area available per memory cell grows progressively smaller. In order to effectively exploit the available area, the selection transistor can be formed as a vertical transistor at the sidewall of a trench above a trench capacitor. Memory cells with a vertical selection transistor are known from U.S. Pat. No. 5,744,386, for example. Additional embodiments of trench capacitors and transistors are described in U.S. Pat. No. 5,208,657.

The disadvantage of the memory cells taught by the prior art which have a trench capacitor and a vertical selection transistor, is that they require a cell area of a least 5 $F^2$, where F is the smallest reproducible unit of lithography measurement.

SUMMARY OF THE INVENTION

It is accordingly an object of the invention to provide a method for producing a memory cell of a semiconductor memory, which overcomes the above-mentioned disadvantages of the heretofore-known devices and methods of this general type and which provides for an alternative with which memory cells with only 4 $F^2$ are possible.

With the foregoing and other objects in view there is provided, in accordance with the invention, a method of producing a memory cell of a semiconductor memory, which comprises the following method steps:

providing a substrate;

forming a first trench in the substrate;

depositing a capacitor dielectric in the trench;

depositing a conductive trench fill in the trench;

sinking the conductive trench fill into the trench;

depositing a first insulating layer on the conductive trench fill in the trench;

overgrowing the first insulating layer epitaxially with an epitaxial layer, proceeding from the substrate;

forming a second trench in the epitaxial layer, the second trench extending through the first insulating layer to the conductive trench fill, and thereby removing a part of the substrate to the conductive trench fill, and forming a ridge from the epitaxial layer;

etching the first insulating layer, thereby undercutting the epitaxial layer;

depositing and sinking a contact layer, whereby the contact layer remains in an undercut region beneath the epitaxial layer;

depositing and sinking a second insulating layer in the second trench;

forming a gate oxide at the ridge;

forming lateral margin ridges as a gate on the gate oxide; incorporating dopant into the ridge, thereby forming a doped region;

forming a bit line on the doped region;

forming a word line over the bit line; and forming a word line contact for electrically connecting the gate to the word line.

The transistor is formed in the ridge which was structured from the epitaxial layer. The advantage of this is that a floating body effect of the vertical transistor is prevented, since the epitaxial layer is electrically connected to the substrate, and therefore charge can drain into the substrate. Another advantage of the novel process according to the invention is the small cell area of 4 $F^2$, which makes possible an effective exploitation of the substrate surface. Another advantage is that an additional insulation such as an STI in the cell field, which typically insulates an active region, is not required here. Another advantage is that an insulating collar in the trench can be forgone, since there is no parasitic transistor at the outer wall of the trench.

In accordance with an advantageous development of the inventive method, the second trench is so formed that it is off-set from the trench by more than one-third the width of the trench. The staggered formation of the second trench relative to the trench makes possible the inventive electrical connecting of the conductive trench fill to the selection transistor by means of undercutting the epitaxial layer and depositing the contact layer into the undercut region.

In accordance with an additional step in the method, the epitaxial layer is undercut. This creates a hollow space which is suitable for accepting a contact layer.

Another development of the inventive method provides that the contact layer is deposited conformally and then removed from the second trench by a targeted etching technique. With this step, the contact layer remains below the epitaxial layer, it being possible to prevent the eroding of the contact layer through the epitaxial layer with a targeted etching technique.

Another variant of the method provides that the contact layer is formed from doped silicon.

It is also provided that the second insulating layer is deposited conformally on the substrate and in the second trench, leveled by chemical-mechanical polishing, and etched back in the second trench. An insulating layer is thereby formed on the bottom of the second trench which insulates the contact layer from subsequently deposited conductive layers.

A further step provides that, following the sinking of the insulation layer, a sacrificial oxide layer is thermally formed, which is then chemically removed. This technique is suitable for cleaning a silicon surface and eliminating crystal defects thereof, because the top layers of the silicon surface are oxidized, and the oxide layer is then removed. This is suitable for treating the channel surface, on which a gate oxide can then be deposited.

A further step provides that the gate is deposited conformally with a thickness of one-third plus or minus one-sixth the width of the trench, and anisotropically etched, whereby the gate is formed as a lateral margin ridge. This makes it possible to form the gate as a lateral margin ridge in the form of a sleeve around the ridge, the ridge being structured from the epitaxial layer.

A further step provides that an insulating layer is deposited as a bit line sleeve on and at the side of the bit line. This makes it possible to utilize the bit line sleeve as a self-aligned etch mask in subsequent etching steps. A self-aligned formation of the word line contact is therefore possible.

Other features which are considered as characteristic for the invention are set forth in the appended claims.

Although the invention is illustrated and described herein as embodied in a method for producing a cell of a semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
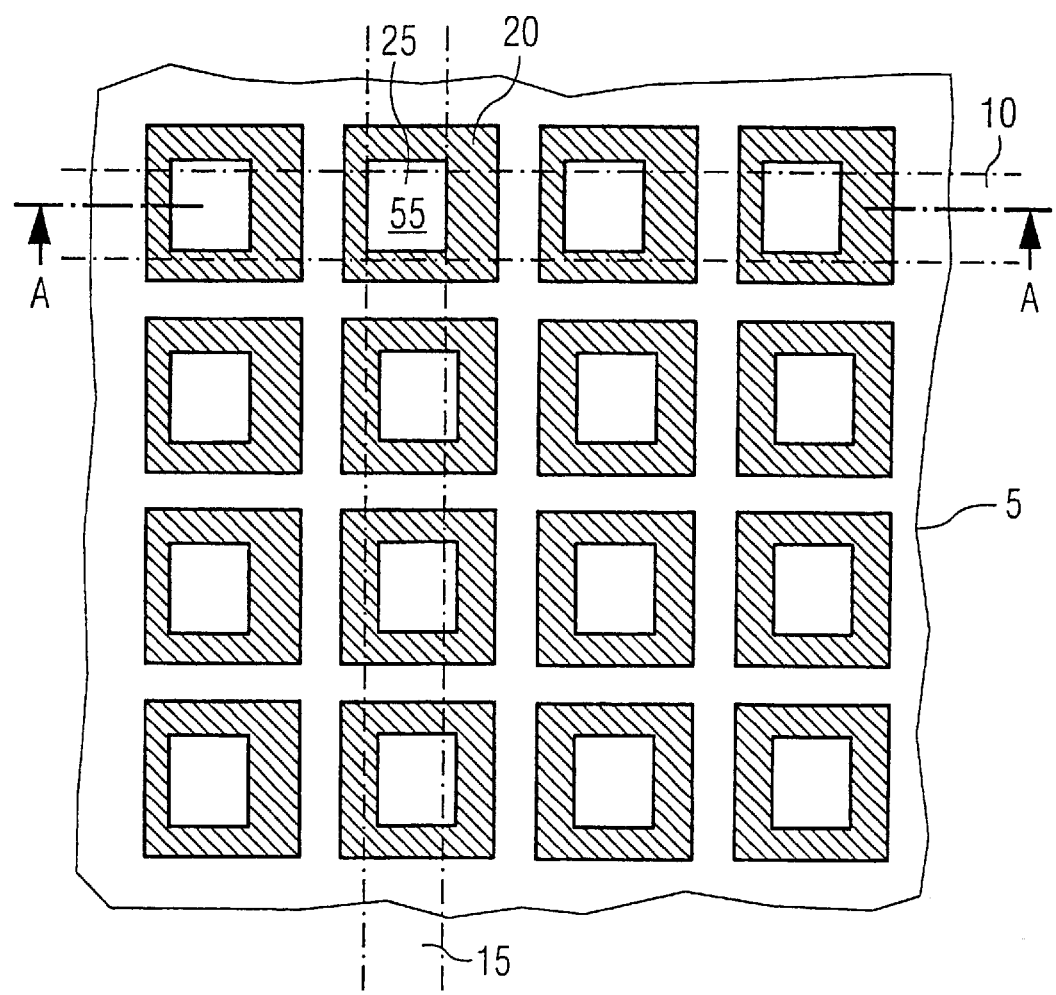
FIG. 1 is a plan view onto a memory cell field with a gate, a word line, and a bit line.

Referring now to the figures of the drawing in detail and first, particularly, to FIG. 1 thereof, there is shown a plan view of a segment of a memory cell field. An epitaxial layer 55 is arranged on the substrate 5. A ridge 25 is structured from the epitaxial layer 55. A gate 20 is arranged around the ridge 25. A bit line 15 extends on the ridge 25, and a word line 10 extends perpendicular to the bit line 15.

Figure 2:
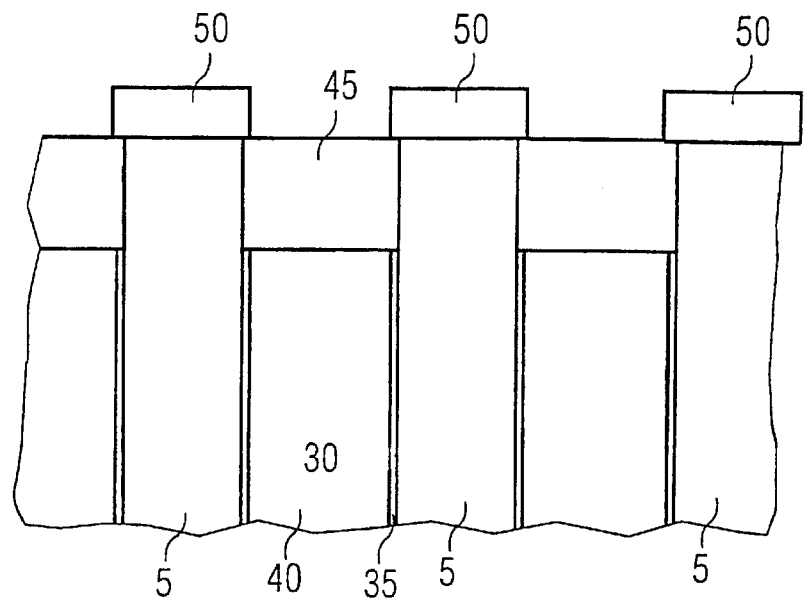
FIGS. 2 to 9 are partial, sectional views along the line A—A in FIG. 1, illustrating a method for producing a memory cell according to the invention.

FIG. 2 is a sectional representation wherein a trench 30 is arranged in the substrate 5, whose sidewall is covered with a capacitor dielectric 35 and which is filled with a conductive trench fill 40. A first insulating layer 45 is arranged over the conductive trench fill 40 in the trench 30. A first mask layer 50 is arranged on the substrate 5.

According to a method for producing the structure represented in FIG. 2, first a substrate 5 is provided, onto which a first mask layer 50 is deposited. A hard-surface mask is deposited onto the first mask layer 50, on which a photoresist mask is arranged, which is photolithographically exposed and then developed. The photoresist mask is utilized for structuring the hard-surface mask and the first mask layer 50. This is carried out in an etching step, for example. Next, the photoresist is removed, and the trench 30 is etched into the substrate 5, whereby the hard-surface mask is utilized as the etching mask. Next, the capacitor dielectric 35 is formed in the trench 30. This can be accomplished by thermal oxidation or thermal nitridation, but also CVD. Next, the conductive trench fill 40 is deposited into the trench 30.

The first mask layer 50 is formed from silicon nitride. The hard-surface mask can be formed from silicon oxide. The capacitor dielectric is made of silicon oxide, silicon nitride, or silicon oxynitride. The conductive trench fill 40 is formed from heavily doped polysilicon. The polysilicon can be n-doped or p-doped, the dopant being phosphorous, arsenic, or boron.

Next, the conductive trench fill 40 is removed from the first mask layer 50 by a CMP step and sunk into the trench 30 by an etching process. The capacitor dielectric 35 is removed from the upper region of the trench 30 located above the conductive trench fill 40. The first insulating layer 45 is formed in the upper region of the trench 30. To accomplish this, an HDP (high density plasma) oxide is deposited, for example. An HDP oxide is deposited in an HDP-CVD process (High Density Plasma Chemical Vapor Deposition). Next, the first insulating layer 45 is removed from the first mask layer 50 by a CMP process and sunk into the trench 30 to the surface of the substrate 5. The HDP oxide is a silicon oxide, for example.

Figure 3:
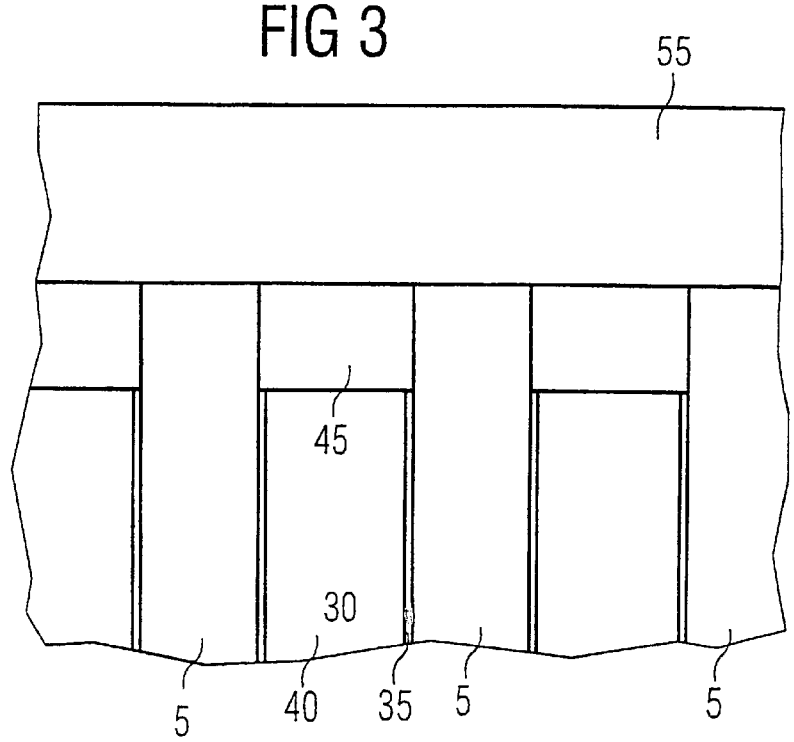

With reference to FIG. 3, the first mask layer 50 is removed from the substrate 5, and then a selective epitaxy layer 55 is selectively and epitaxially grown on the substrate 5. The first insulating layer 45 is overgrown laterally starting from the exposed substrate 5.

Figure 4:
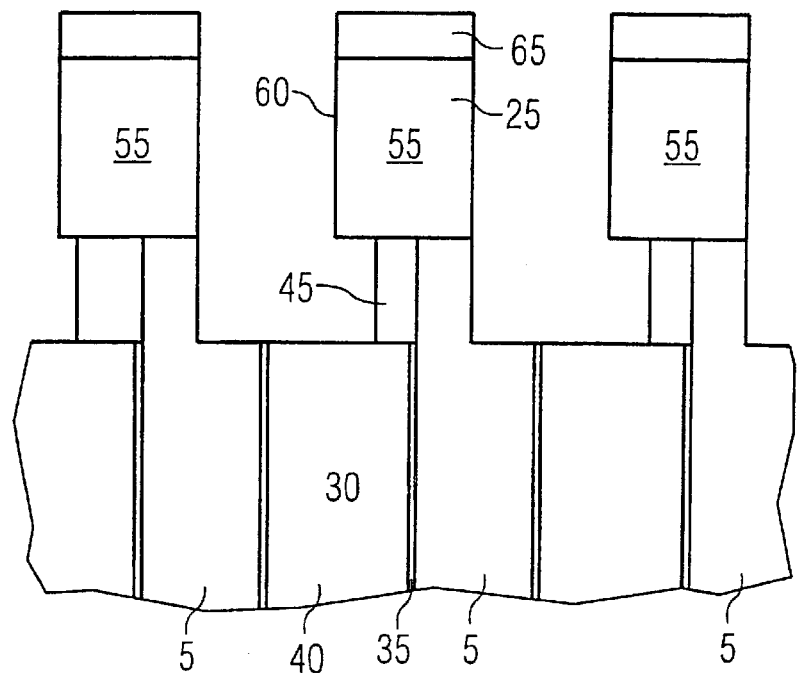

With reference to FIG. 4, a second mask layer 65, for instance a silicon nitride layer, is deposited on the epitaxially grown layer 55. Next, a photoresist mask is applied, which is phototechnically exposed and then developed. In an etching step in which the photoresist mask is utilized as the etching mask, a second trench 60 is structured into the second mask layer 65, the epitaxial layer 55 and the first insulating layer 45, and into the substrate 5 as well. The second trench 60 extends to the conductive trench fill 40. Next, the photoresist mask is removed, and the first insulating layer 45 is isotropically and wet-chemically etched, so that the epitaxial layer 55 is undercut.

Figure 5:
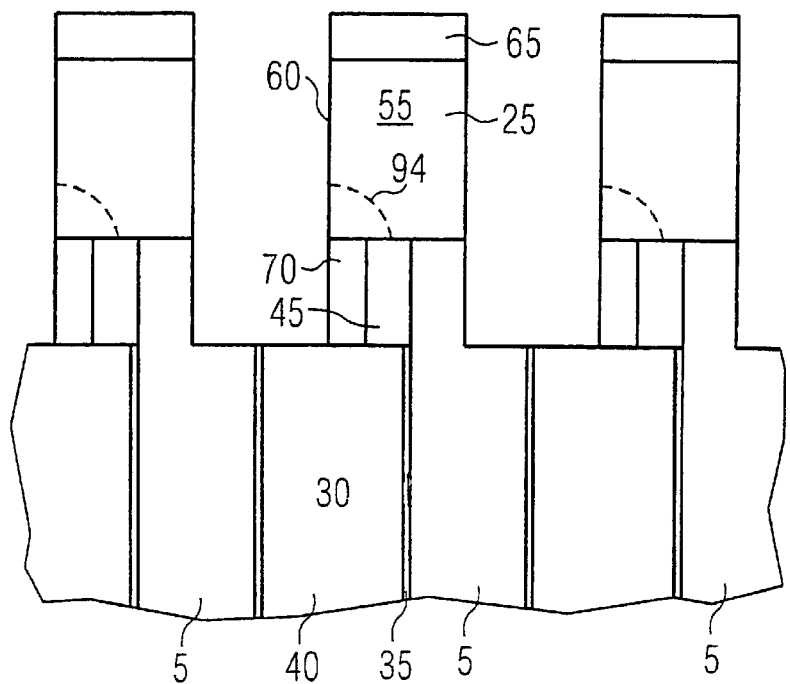

With reference to FIG. 5, the contact layer 70 is formed next. To accomplish this, the contact layer 70 is first deposited into the second trench 60 and on the second mask layer 65 and then removed from the second mask layer 65 by a targeted etching step. The contact layer 70 beneath the epitaxial layer 55 remains, since this region is shadowed during the targeted etching process. The contact layer 70 is formed from n-doped polysilicon, for instance.

Next, in a temperature step, dopant can diffuse from the contact layer 70 into the ridge 25, forming a diffusion region 94 in the ridge 25. The diffusion region 94 can be utilized as a lower source zone or a drain zone of a vertical transistor.

Figure 6:
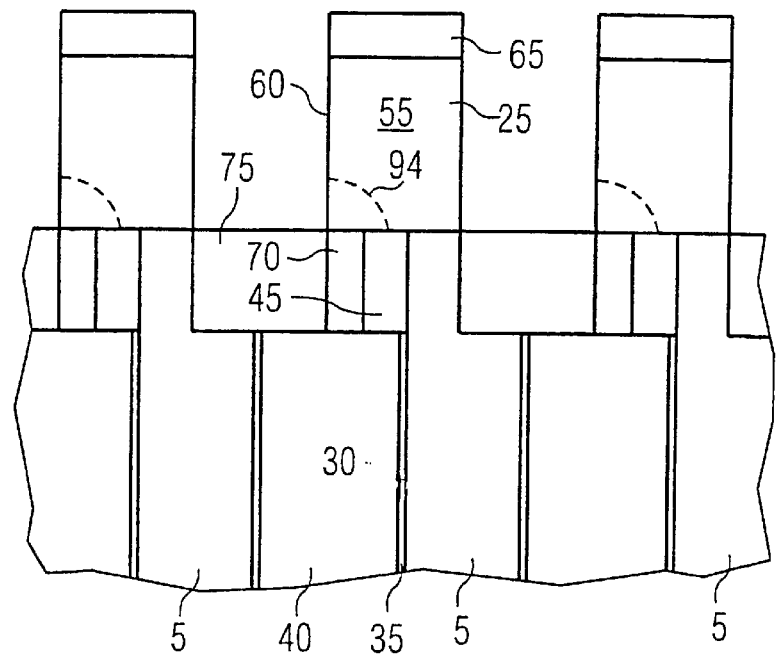

Next, with reference to FIG. 6, a second insulating layer 75 is formed in the second trench 60. To accomplish this, a silicon oxide is deposited by an HDP-CVD process. Silicon oxide is also adsorbed on the second mask layer 65. Next, a CMP step is carried out, which removes the silicon oxide of the second insulating layer 75 from the second mask layer 65. The second insulating layer 75 is then sunk into the second trench 60.

Figure 7:
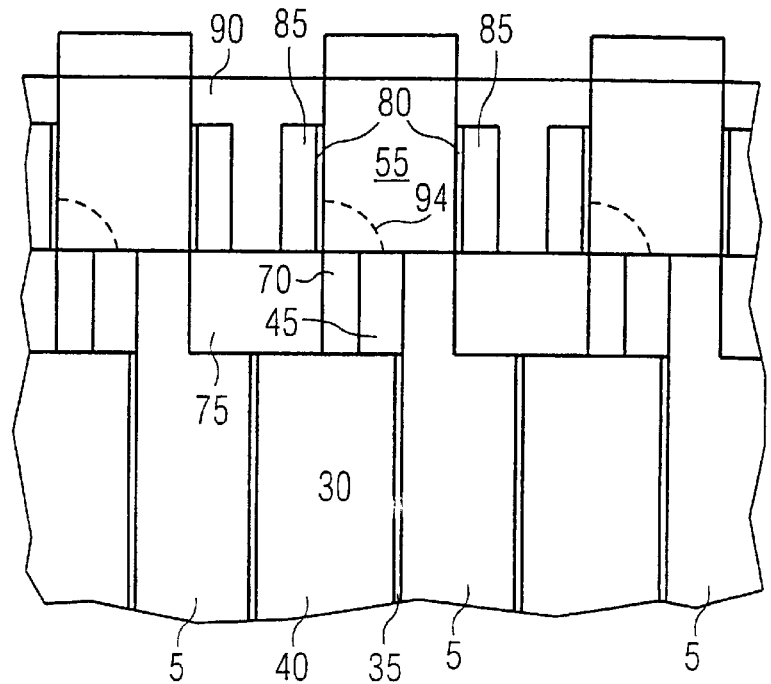

With reference to FIG. 7, a sacrificial oxide is thermally grown on the sidewall of the ridge 25 in the trench 60 and then removed. This improves the surface quality of the ridge 25, as a result of which a channel of a transistor that will later be formed on the surface of the ridge 25 can also be improved. Next, a gate oxide 80 is grown on the sidewall of the ridge 25 in a temperature step. The gate 85 is deposited conformally, being arranged on the second mask layer 65, the gate oxide 80 and the bottom of the second trench 60. The thickness of the gate 85 is approximately one-third the width of the second trench 60. Next, anisotropic etching is performed, whereby the gate 85 is formed as a lateral margin ridge next to the ridge 25. The gate 85 is formed from doped polysilicon, for example. Next, a third insulating layer 90 is formed in the second trench 60. To accomplish this, a silicon oxide is deposited in the second trench 60 and on the second mask layer 65 and then planarized in a CMP step. Next, the second mask layer 65 is removed from the ridge 25.

Figure 8:
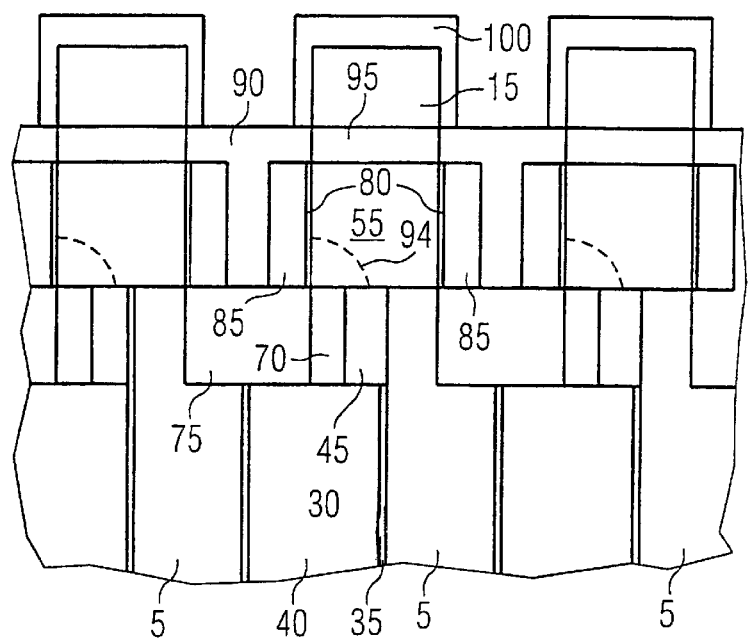

With reference to FIG. 8, a dopant implantation is carried out, forming a doped region 95 in the ridge 25. The dopant can also be incorporated by gas-phase doping or diffusion. The doped region 95 can be utilized as a source zone or drain zone of the vertical transistor. Next, a barrier layer is optionally deposited on the third insulating layer 90 and the doped region 95. Next, the bit line 15 (for instance tungsten silicide) is deposited on the barrier layer. A nitride layer and a photoresist mask are deposited on the bit line 15. The photoresist mask is phototechnically exposed and developed, and the nitride layer, the bit line 15, and if present the barrier layer, are then structured with the aid of the photoresist mask. The bit line 15 and the top part of the bit line sleeve 100 are therein formed from silicon nitride. The photoresist mask is then removed, and a nitride layer is conformally deposited and structured as a lateral margin ridge by anisotropic etching. The bit line sleeve 100 around the bit line 15 is thus also formed from silicon nitride.

Figure 9:
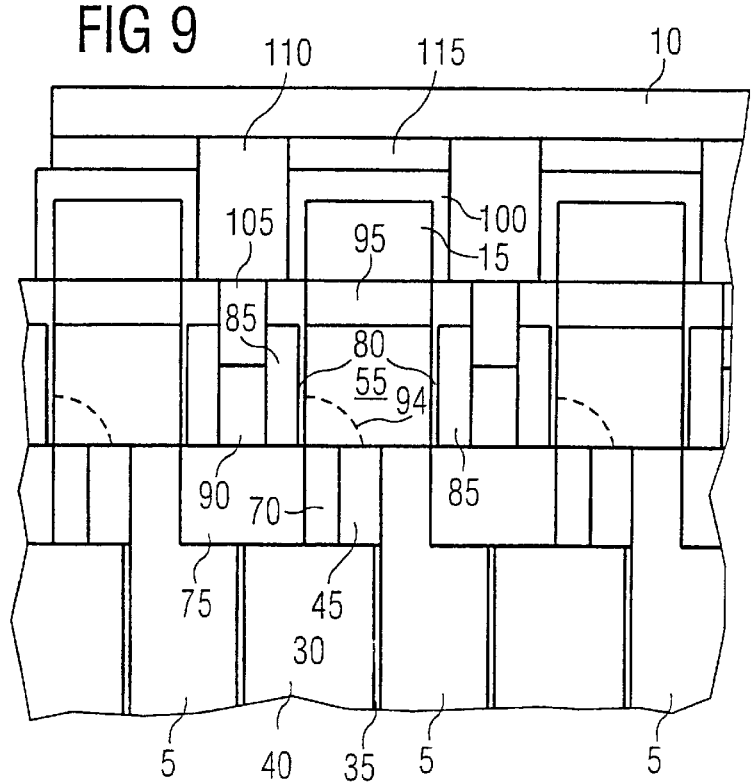

With reference to FIG. 9, a fourth insulating layer 115 is deposited and planarized by CMP. The fourth insulating layer 115 consists of silicon oxide. Next, a phototechnical step for structuring the word line 10 is carried out. Trenches are thereby formed in the fourth insulating layer 115, in which trenches the fourth word line 10 is subsequently arranged. Before the word line 10 is arranged in the trenches in the fourth insulating layer 115, a second phototechnical step is carried out, in which trenches for the first word line contact 105 and the second word line contact 110 are formed in the fourth insulating layer 115 and the third insulating layer 90. Next, a barrier layer is deposited in the trenches and contact holes thus formed, and the word line 10, the first word line contact 105 and the second word line contact 110 are deposited and planarized by a tungsten deposition and a subsequent tungsten-CMP step.

We claim:

1. A method of producing a memory cell of a semiconductor memory, which comprises the following steps:

providing a substrate;

forming a first trench in the substrate;

depositing a capacitor dielectric in the trench;

depositing a conductive trench fill in the trench;

sinking the conductive trench fill into the trench;

depositing a first insulating layer on the conductive trench fill in the trench;

overgrowing the first insulating layer epitaxially with an epitaxial layer, proceeding from the substrate;

forming a second trench in the epitaxial layer, the second trench extending through the first insulating layer to the conductive trench fill, and thereby removing a part of the substrate to the conductive trench fill, and forming a ridge from the epitaxial layer;

etching the first insulating layer, thereby undercutting the epitaxial layer;

depositing and sinking a contact layer, whereby the contact layer remains in an undercut region beneath the epitaxial layer;

depositing and sinking a second insulating layer in the second trench;

forming a gate oxide at the ridge;

forming lateral margin ridges as a gate on the gate oxide;

incorporating dopant into the ridge, thereby forming a doped region;

forming a bit line on the doped region;

forming a word line over the bit line; and forming a word line contact for electrically connecting the gate to the word line.

2. The method according to claim 1, wherein the step of forming the second trench comprises forming the second trench so that the second trench is offset from the first trench by more than one-third a width of the first trench.

3. The method according to claim 1, which comprises undercutting the epitaxially grown layer.

4. The method according to claim 1, which comprises depositing the contact layer conformally and then removing the contact layer from the second trench by a targeted etching technique.

5. The method according to claim 1, which comprises forming the contact layer from doped silicon.

6. The method according to claim 1, wherein the step of depositing and sinking the second insulating layer comprises depositing the second insulating layer on the substrate and in the trench conformally, planarizing by chemical-mechanical polishing, and etcheding back into the second trench.

7. The method according to claim 1, which comprises, subsequently to sinking the insulating layer, thermally forming a sacrificial oxide layer and then chemically removing the sacrificial oxide layer.

8. The method according to claim 1, which comprises depositing the gate conformally with a thickness of one-third plus or minus one-sixth a width of the first trench and anisotropically etching, whereby the gate is formed as a lateral margin ridge.

9. The method according to claim 1, which comprises depositing an insulating layer on and at a side of the bit line as a bit line sleeve.

* * * * *